United States Patent
Bai et al.

(10) Patent No.: US 8,321,747 B2
(45) Date of Patent: Nov. 27, 2012

(54) QC-LDPC CODE DECODER AND CORRESPONDING DECODING METHOD

(75) Inventors: Dong Bai, Beijing (CN); Tao Tao, Beijing (CN); Qun Li, Beijing (CN); Ju Ma, Beijing (CN); Qinghua Yang, Beijing (CN); Qiusheng Wang, Beijing (CN); Ruirui Ye, Beijing (CN); Wen Chen, Beijing (CN); Xiaowei Cao, Beijing (CN); Hongbing Shen, Beijing (CN)

(73) Assignee: TIMI Technologies Co., Ltd., Beijing (CN)

( * ) Notice: Subject to any disclaimer, the term of this patent is extended or adjusted under 35 U.S.C. 154(b) by 353 days.

(21) Appl. No.: 12/669,277

(22) PCT Filed: Jun. 19, 2008

(86) PCT No.: PCT/CN2008/001192
§ 371 (c)(1),
(2), (4) Date: Jan. 15, 2010

(87) PCT Pub. No.: WO2009/009950
PCT Pub. Date: Jan. 22, 2009

(65) Prior Publication Data
US 2010/0192044 A1  Jul. 29, 2010

(30) Foreign Application Priority Data
Jul. 18, 2007  (CN) .......................... 2007 1 0119206

(51) Int. Cl.
*H03M 13/00* (2006.01)

(52) U.S. Cl. .................................... 714/752; 714/758
(58) Field of Classification Search .................. 714/752, 714/758
See application file for complete search history.

(56) References Cited

U.S. PATENT DOCUMENTS

| | | | |
|---|---|---|---|
| 2006/0109821 A1 | 5/2006 | Xia | |
| 2006/0222000 A1 | 10/2006 | Vannerson et al. | |
| 2007/0033483 A1* | 2/2007 | Jeong et al. | 714/758 |
| 2008/0028282 A1* | 1/2008 | Zhong et al. | 714/794 |
| 2008/0109698 A1* | 5/2008 | Yang et al. | 714/758 |
| 2008/0301521 A1* | 12/2008 | Gunnam et al. | 714/757 |

FOREIGN PATENT DOCUMENTS

| | | |
|---|---|---|
| CN | 1976238 A | 6/2007 |
| WO | WO 2006/057879 A1 | 6/2006 |
| WO | WO 2006/105544 A1 | 10/2006 |

* cited by examiner

*Primary Examiner* — Yolanda L Wilson
(74) *Attorney, Agent, or Firm* — Morgan, Lewis & Bockius LLP

(57) ABSTRACT

An efficient general QC-LDPC code decoder includes a general-purpose processor for distributing the storage storage space of the data memory block, and establishing an index for data addressing; a data memory block for storing the information used during decoding; a hardware accelerator for conducting part or all of the information processing operations including parity check, check node updating and variable node updating. A corresponding QC-LDPC code decoding method includes initializing the variable node information and performing parity check on the check matrix row block by row block; updating the check node row block by row block and updating the variable node column block by column block if any check equation is not met.

16 Claims, 4 Drawing Sheets

QC-LDPC CODE DECODER AND CORRESPONDING DECODING METHOD

The present application is a U.S. National Phase Application of International Application No. PCT/CN2008/001192, filed Jun. 19, 2008, which claims priority to Chinese Patent Application No. 200710119206.6, filed Jul. 18, 2007, which are hereby incorporated by reference in their entirety.

BACKGROUND OF THE INVENTION

1. Field of Invention

The present invention relates to the error-correcting code in digital communication system, particularly to a decoding method of QC-LDPC code used as an error-correcting coding method.

2. Description of Prior Art

Due to noise and interference, errors may occur in digital signals during transmission. Therefore, error-correcting code technique is generally applied to ensure reliable transmission in communication system. First proposed by Gallager, Low-Density Parity Check (LDPC) code is a linear block error-correcting code of highly sparse check matrix with the number of "1" far less than that of "0". Further study by Mackay shows that the performance of LDPC codes can approach Shannon Limit under Belief Propagation decoding algorithm, and the decoding method is far less complex than that of Turbo codes and has a relatively low Error Floor. Thus, LDPC is generally regarded as one of the most promising error-correcting coding methods today.

To solve the problem of the high complexity of LDPC code decoding, a type of LDPC code with Quasi Circulant structure has been proposed in recent years. The check matrix of QC-LDPC code consists of several sub matrices, each comprising either of a single zero matrix, or of a single, or in more general form, several Circulant Permutation Matrices are derived from circular shift on identity matrix. QC-LDPC code can be coded through means of simple shift register and the regularity of its check matrix structure can greatly reduce the storage space needed for check matrices and facilitate the data addressing in decoding process.

The decoding process of LDPC code is a procedure of message passing of continuous iteration, which generally includes the following 4 steps:

1. Initialization: Computing initial information of each variable node based on the code element signal received.

2. Check node updating: Computing new check node information based on the information transmitted from its connected variable node and pass on the result to the variable node.

3. Variable node updating: Computing new variable node information based on the information transmitted from its connected check node.

4. Parity check: insert the new variable node information into check formulas and perform parity check. If all the check formulas are met, the decoding is deemed to be successful; If certain check formula is not met, the new variable node information is transmitted again to check node and step 2 and 3 are repeated until decoding is successful or the maximal iteration number is reached.

LDPC code decoder is usually realized through applying specialized hardware circuit and improves its decoding throughput by parallel structure. However, its fixed structure can hardly satisfy the decoding of LDPC code with different parameters (code length and code rate) and check matrix structures. Although using software can achieve the universality of LDPC code decoder, it will cost a great amount of computing time processing complex information, particularly check node updating, thus barely able to achieve efficient decoding throughput.

SUMMARY OF THE INVENTION

To solve the above problems, the present invention proposes an efficient general QC-LDPC code decoder by focusing on the structure of QC-LDPC code and through application of software and a supplementary hardware accelerator. The invention comprises:

A general-purpose processor for distributing the storage space of the data memory area based on the structure of QC-LDPC code check matrix, establishing an index for data addressing, controlling decoding process, scheduling information processing operations and conducting part of information processing operations, including parity check, check node updating and variable node updating.

A data memory area for storing the information needed for the decoding process, block by block, wherein the information includes initial information of the variable nodes, check node and variable node information during iteration. The information is stored block by block in accordance with the quasi circulant feature of the QC-LDPC code check matrix.

A hardware accelerator for conducting part or all of the information processing operations including parity check, check node updating and variable node updating.

The hardware accelerator also includes: a data interface for adapting the time sequence and format of write-in/read-out data; a data buffer for storing intermediate variables during information processing; a computing unit for conducting computation of the needed information; a control unit for controlling the operation of the hardware accelerator.

Another aspect of the invention provides an efficient general QC-LDPC code decoding method, which comprises the following steps:

distributing storage space for a data memory area based on the structure of QC-LDPC code check matrix and to establishing an index for data addressing by a general-purpose processor (1);

storing block by block the information needed for the decoding process by the data memory area, wherein the information includes initial information of variable nodes, check node and variable node information during iteration. The information is stored block by block in accordance with the quasi circulant feature of the QC-LDPC code check matrix.

Initializing the data memory area and performing parity check row block by row block by the general-purpose processor or a hardware accelerator;

If the check equations of all the row blocks are met, an input judgment is made; if certain check equation is not met, using the general-purpose processor or the hardware accelerator to update the check nodes and update the variable nodes column block by column block under the scheduling of the general-purpose processor;

Transmitting the information block by block between the general-purpose processor and the hardware accelerator;

If the maximal iteration number is reached, an input judgment is made; if not, repeats the steps of parity check and starts a new round of iteration.

The technological scheme proposed by the present invention has the following one or several advantages:

1. The solution provides greater universality, capable of decoding QC-LDPC code with different parameters (code length, code rate) and check matrix structures;

2. Since the more complicated part of the information processing during decoding is accomplished by the hardware accelerator, the decoding throughput is greatly improved, thus meeting the demands of broad-band transmission.

3. Because the information is stored, processed and transmitted block by block in accordance with the quasi circulant feature of QC-LDPC code check matrix, the decoding efficiency is enhanced.

4. The solution can be used with both regular and irregular QC-LDPC code.

5. The solution can be used with various decoding algorithms of information transmission.

6. The solution can be used with various scheduling strategies of information transmission.

BRIEF DESCRIPTION OF THE DRAWINGS

FIG. 3 is a diagram of the QC-LDPC code check matrices according to the first embodiment of the present invention;

DETAILED DESCRIPTION OF PREFERRED EMBODIMENTS

Hereinafter, in connection with the accompanying figures, the efficient general QC-LDPC code decoder of the invention will be illustrated in detail in preferred embodiments.

Figure 1:
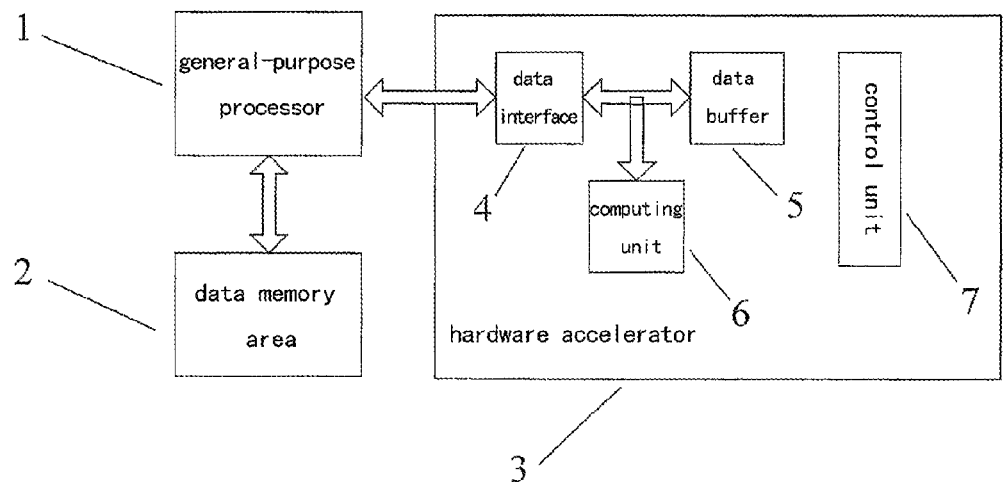
FIG. 1 is a schematic diagram illustrating the composition of a QC-LDPC code decoder according to the first embodiment of the present invention.

FIG. 1 is a schematic diagram illustrating the composition of an QC-LDPC code decoder of the present invention.

As shown in FIG. 1, the QC-LDPC code decoder of the embodiment of the present invention comprises a general-purpose processor 1, a data memory area 2, a hardware accelerator 3.

The general-purpose processor 1 is used for distributing the storage space for the data memory area 2 based on the structure of the QC-LDPC code check matrix, establishing look-up tables, storing structure of check matrices, and providing an index for data addressing during the decoding process. The general-purpose processor 1 is also used for controlling the process of iterant decoding and realizing different scheduling strategies of information transmission such as Flood, Turbo, Shuffle, Group Shuffle and Replica Shuffle by scheduling each information processing unit.

The data memory area 2 is used for storing information needed during the decoding process, such as initial information of variable nodes, check node and variable node information during iteration. The information is stored block by block in accordance with the quasi circulant feature of the QC-LDPC code check matrix, i.e. each circulant permutation matrix can be designated a segment of memory block at any place in the entire memory area 2.

In order to facilitate the information processing and transmission during the decoding process, the memory blocks of the circulant permutation matrices in the same column block (or row block) can be placed along the consecutive addresses in to the memory area 2. For example, during check node updating by the hardware accelerator 3, the corresponding memory blocks of the circulant permutation matrices in the same row block are placed consecutively in the data memory area 2; during variable node updating by the hardware accelerator 3, the corresponding memory blocks of the circulant permutation matrices in the same column block are placed consecutively in the data memory area 2.

In particular, for regular QC-LDPC, because of the identical number of circulant permutation matrices in each column block (row block), the memory blocks can be placed in accordance with certain rules in the data memory area 2, so as to facilitate data addressing during the decoding process. Fox example, the corresponding memory blocks of the circulant permutation matrices in the same row block can be placed consecutively or at identical intervals in the data memory area 2; the corresponding memory blocks of the circulant permutation matrices in the same column block can be placed consecutively or at identical intervals in the data memory area 2.

The hardware accelerator 3 can either be a hardware circuit independent of the general-purpose processor 1, or be integrated with the general-purpose processor 1 as a special coprocessor, or be an additional set of special commands based on the command set of the general-purpose processor 1, specifically designed for QC-LDPC decoding. The hardware accelerator 3 is used to accomplish part or all the information processing functions during the decoding process, such as parity check, check node updating, variable node updating, with the remaining information processing functions being completed by the general-purpose processor 1.

As shown in FIG. 1, the hardware accelerator 3 includes a data interface 4 for adapting the time sequence and format of write/read data, a data buffer 5 for storing intermediate variables during information processing, a computing unit 6 for accomplishing the computation processing of the information and a control unit 7 for controlling the operation of the hardware accelerator 3.

During the above mentioned information processing, the parity check and check node updating are carried out row block by row block. Since the circulant permutation matrices are derived from circular shifting of an identity matrix at the positions of "1", it is easy to locate the variable nodes of every check equations involved in the row block and perform parity check, and also easy to locate the is variable nodes updated by every check node involved in the row block and compute the new check node information, based on the offset of each circulant permutation matrix relative to identity matrix. The variable node updating is carried out column block by column block. Also due to the circulant permutation matrices are derived from circular shifting of an identity matrix at the positions of "1", it is easy to locate the check nodes updated by every variable node involved in the column block and compute the new variable node information, based on the offset of each circulant permutation matrix relative to identity matrix.

During the above mentioned information processing, different decoding algorithms such as Standard BP, Min-Sum, Normalized BP and Offset BP can be used according to different computing rules.

Since the information processing operations in the check node updating are most complicated, these functions are handled by the hardware accelerator 3. In addition, because Min-Sum decoding algorithm is relatively more suitable to be realized by hardware and after certain modification its performance is almost same as Standard BP decoding algorithm, the improved decoding algorithm based on Min-Sum can be applied during check node updating. The structure of a hardware accelerator realizing the above mentioned functions is illustrated in FIG. 2.

Figure 2:
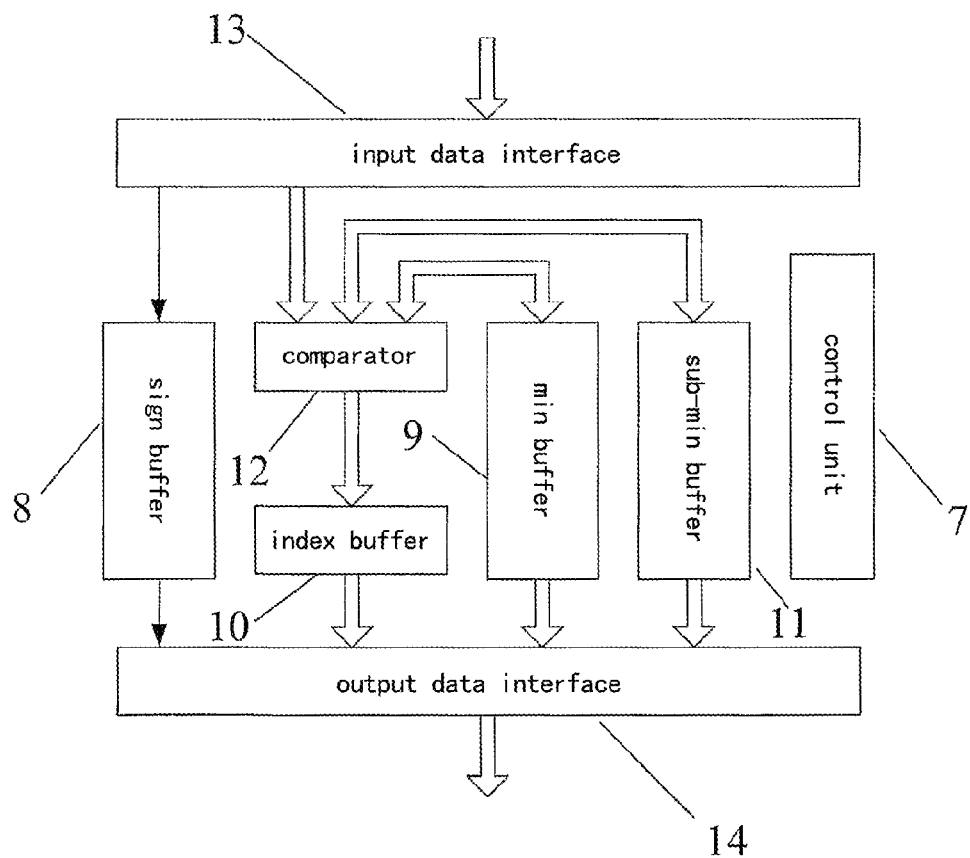
FIG. 2 is a diagram illustrating a preferred structure of the hardware accelerator shown in FIG. 1.

FIG. 2 is a diagram illustrating a preferred structure of the hardware accelerator shown in FIG. 1.

As shown in FIG. 2, the hardware accelerator 3 includes 4 data buffers: a sign buffer 8 for storing signs of the variable node information; a Min buffer 9 for storing minimums of the absolute values of the variable node information involved in the updating of the same check node; an Index buffer 10 for storing the positions of the variable nodes with the minimum absolute values; and a Sub-Min buffer 11 for storing the second minimums of the absolute values of the variable node information involved in the updating of the same check node.

Variable node information is inputted into the hardware accelerator 3 from general-purpose processor 1 block by block. The input data interface 13 inputs the signs of the information into the Sign buffer 8, and its absolute value into the comparator 12. Since the circulant permutation matrices are derived from circular shifting of an identity matrix at the positions of "1", the control unit 7 can easily identify which check node the current inputted variable node information is involved in updating based on the offset of each circulant permutation matrix relative to identity matrix, obtain a new minimum, a new second minimum and the position of the new minimum by comparing the absolute value of the current inputted variable node information with the minimum and the second minimum of the absolute values of the variable node information that have also involved in the updating of the same check node and been written into the Min buffer 9 and the Sub-Min buffer 11, respectively, and update the content of the Min buffer 9, the Sub-Min buffer 11 and the Index buffer 10 according the comparison results.

After the variable node information is written in the, general-purpose processor 1 read out check node information block by block from the hardware accelerator 3. And after certain correction and modification, the output data interface 14 outputs new check node information according to the values in the Sign buffer 8, the Min buffer 9, the Sub-Min buffer 11 and the Index buffer 10.

The first embodiment of the invention will be illustrated and explained below accompanied with the drawings.

Figure 3:
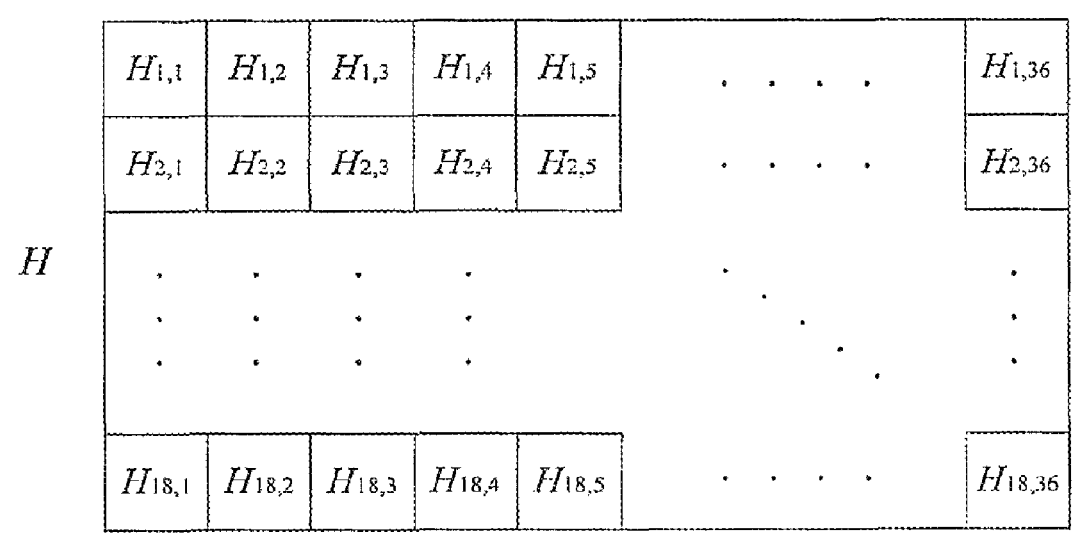

FIG. 3 is a diagram of the QC-LDPC code check matrix H used in the first embodiment of the present invention.

As shown in FIG. 3, the present embodiment uses the regular (3, 6) QC-LDPC code with a code length of 9216 and a code rate of ½. Its check matrix H is composed of 18×36 sub matrices, each with 256 elements.

The check matrix H is divided into 18 row blocks vertically, each with 6 circulant permutation matrices; and into 36 column blocks horizontally, each with 3 circulant permutation matrices, thus making a total of 18×6=36×3=108 circulant permutation matrices.

In the QC-LDPC code decoder in the embodiment, the general-purpose processor 1 is a Digital Signal Processor (DSP). The data memory area 2 is the Random Access Memory (RAM) embedded in the DSP. The parity check and variable node updating are handled by DSP, and the check node updating by the hardware accelerator 3 which is a Field Programmable Gate Array in the present embodiment.

The QC-LDPC code decoder in the present embodiment applies Normalized BP decoding algorithm, calculated in accordance with the following formulas:

Initialization:

$$Z_{nm}^{(0)} = LLR_n \quad (1)$$

$$Z_n^{(0)} = LLR_n \quad (2)$$

Wherein, $Z_n$ indicates the information of the variable node n, while $Z_{nm}$ indicates the information transmitted from the variable node n to the check node m. $LLR_n$ indicates the Log-Likelihood Ratio of each recipient code element.

Check Node Updating:

$$L_{mn}^{(t)} = \left( \prod_{n' \in N(m) \backslash n} \text{sign}(Z_{n'm}^{(i-1)}) \right) \times \left( \frac{\min_{n' \in N(m) \backslash n} |Z_{n'm}^{(i-1)}|}{\alpha} \right) \quad (3)$$

Wherein, Lmm is the information transmitted from the check node m to the variable node n. $N(m) \backslash n$ indicates the set of all the variable nodes connected with the check node m excepts variable node n. The superscript i indicates the iteration number, the "sign" is symbolic operation, the "min" is minimum operation, and α is normalization factor.

Variable Node Updating:

$$Z_{nm}^{(i)} = LLR_n + \sum_{m' \in M(n) \backslash m} L_{m'n}^{(t)} \quad (4)$$

$$Z_n^{(i)} = LLR_n + \sum_{m' \in M(n)} L_{m'n}^{(i)} \quad (5)$$

Wherein, $M(n) \backslash m$ indicates the set of all the check nodes connected with the variable node n except the check node m, while $M(n)$ is the set of all the check nodes connected with the variable node n.

The above mentioned decoding process requires that the data memory area 2 includes three parts, namely, LLR buffer, Z buffer and L buffer. The LLR buffer with a total of 9216 units of data, is used to store the Log-Likelihood Ratio $LLR_n$ of each recipient code element; the Z buffer, with a total of 9216 units of data, is used to store the variable node information $Z_n$; the L buffer, with a total of 108×256 units of data, is used to store the check node information $L_{mn}$ and the variable node information $Z_{nm}$, i.e. to allocate a segment of 256-byte memory block for each of the 108 circulant permutation matrices. Since each column block has the same number of circulant permutation matrices, the corresponding memory blocks of the circulant permutation matrices in the same column block can be placed circularly at an interval of 36×256=9216.

Three look-up tables, i.e. Position-Table, Shift-Table and Row-Table are established by DSP. With a total of 18 rows, each with 6 columns, the Position-Table records the positions in the Z buffer of the corresponding memory blocks of the 6 circulant permutation matrices in the row block. With a total of 18 rows, each with 6 columns, the Shift-Table records the offsets of the 6 circulant permutation matrices relative to identity matrix. With a total of 18 rows, each with 6 columns, the Row-Table records the positions in the L buffer of the corresponding memory blocks of the 6 circulant permutation matrices.

The QC-LDPC code decoder in the present embodiment uses Flood scheduling strategy for information transmission.

Figure 4:
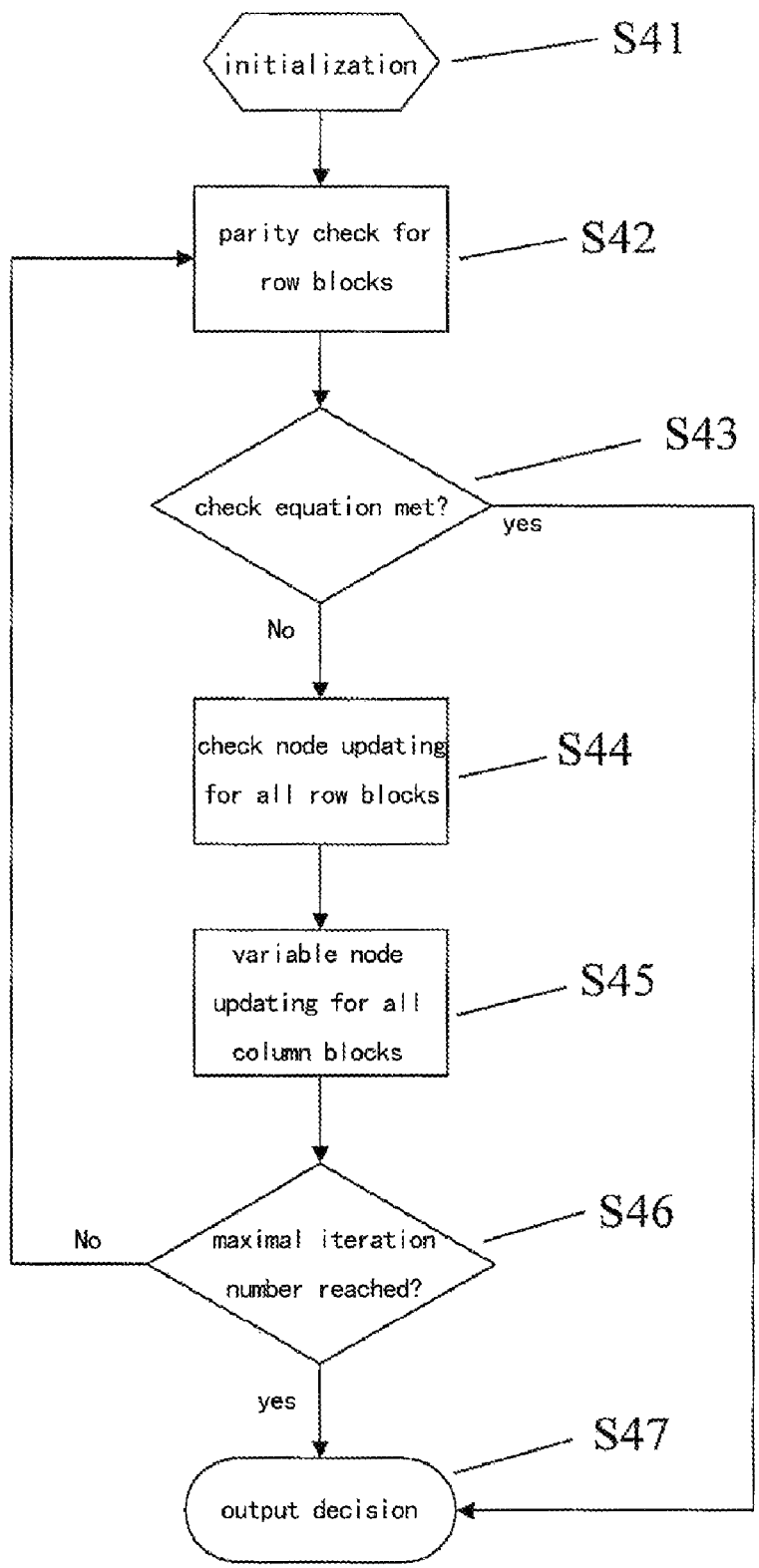
FIG. 4 is a flow diagram illustrating the operation of the QC-LDPC code decoder according to the first embodiment of the present invention.

FIG. 4 is a flow diagram illustrating the operation of the QC-LDPC code decoder used in the present embodiment.

As shown in the diagram, first in the initialization step S41, the values of the variable node information $Z_{nm}$ and $Z_n$ (n=1, 2, ..., 9216, m=1, 2, ..., 4608) are all is initialized as $LLR_n$ (n=1, 2, ..., 9216).

Then in step S42, parity check is performed row block by row block at all row blocks. Since the variable nodes involved in parity check in every row blocks have quasi circulant feature for the positions of the variable nodes, when performing parity check on the row block i (i=1, 2, . . . , 18), DSP initializes 6 pointers to have them point to the positions of the information $Z_n$ of 6 variable nodes involved in the first check equation in the Z buffer, according to the Position-Table and the line i in the Shift-Table.

Figure 5:
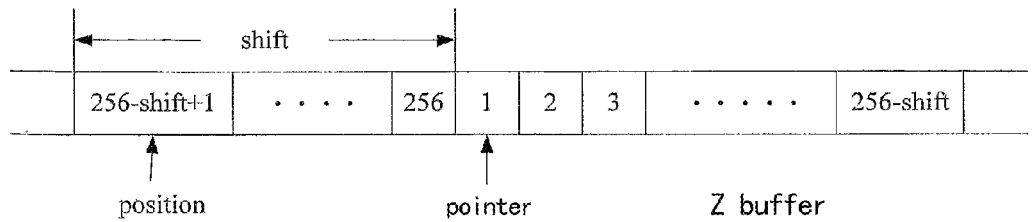
FIG. 5 is a diagram illustrating the corresponding memory blocks of the circulant permutation matrices according to the first embodiment of the present invention.

FIG. 5 is a diagram illustrating the corresponding memory blocks of the circulant permutation matrix in the present embodiment.

As shown in the figure, the memory block is the corresponding memory block of the circulant permutation matrix with an offset of "shift" and is located at "position" in the Z buffer. The number in the figure indicates the index number of the check equation that the variable node is involved in. Through Circular Addressing, the positions in the Z buffer of the 6 variable node information $Z_n$ involved in every check equations in the row block can be easily identified. Parity check is carried out using the sign of $Z_n$ until 256 check equations in the row block are computed.

After parity check is completed at all row blocks, the flow proceeds into step S43, which determines whether all the check equations are met. If the check equations of all the row blocks are met, the decoding is deemed successful and the flow proceeds into step S47, where an output decision is made according to the sign of $Z_n$.

If certain check equation is determined to be not met in step S43, the flow enters step S44 to perform check node updating for all row blocks.

Check node updating is also carried out row block by row block. When performing check node updating for the row block i (i=1, 2, . . . , 18), DSP can locate the corresponding memory blocks of the 6 circulant permutation matrices in the L buffer according to the line i of the Row-Table. Then the variable node information of the 6 blocks (each with 256 units of data) is written into FPGA through the input data interface 13.

As shown in FIG. 2, FPGA includes 4 data buffers, namely, a Sign buffer 8, a Min buffer 9, an Index buffer 10 and a Sub-Min buffer 11. With a total of 6×256 signs, the Sign buffer 8 is used to store signs of variable node information; with a total of 256 units of data, the Min buffer 9 is used to store minimums of the absolute values of variable node information involved in the updating of the same check node (altogether there are 256 check nodes); with a total of 256 units of data, the Index buffer 10 is applied to store positions of the variable nodes with minimum absolute values; with a total of 256 units of data, the Sub-Min buffer 11 is applied to store the second minimums of the absolute values of variable node information involved in the updating of the same check node.

FPGA inputs the signs of the information into the Sign buffer 8, the absolute value into the comparator 12. In the same way, since the variable nodes involved in the updating of check nodes in every row blocks have quasi circulant feature for the positions of the variable nodes, FPGA can easily identify which check node the current inputted variable node information $Z_{nm}$ is involved in updating based on the line i of the Shift-Table. A new minimum, a new second minimum and the position of the new minimum are obtained by comparing the absolute value of the current inputted variable node information with the minimum and the second minimum of the absolute values of the variable node information involved in the updating of the same check node and written into the Min buffer 9 and the Sub-Min buffer 11, respectively. Based on the comparison results, the content in the Min buffer 9, the Sub-Min buffer 11 and the Index buffer 10 is updated.

After the variable node information is written in, DSP read out from FPGA the check node information of the corresponding 6 blocks (each with 256 units of data) through the output data interface 14 and update the L buffer. FPGA then outputs the new check node information Lmn using the formula (3) according to the values in the Sign buffer 8, the Min buffer 9, the Sub-Min buffer 11 and the Index buffer 10.

Since Direct Memory Access (DMA) can be applied in the data transmission between DSP and FPGA, the parity check in step S42 and the check node updating in step S44 can be conducted synchronously in other embodiments in order to further enhance the decoding throughput.

After the check node updating of all the row blocks is completed in step S44, the procedure enters step S45 to perform variable node updating for all the column blocks.

The variable node updating in step S45 is carried out column block by column block. When performing variable node updating for the column block j (j=1, 2, . . . , 36), DSP can easily locate the corresponding memory blocks of the 3 circulant permutation matrices of the same column block in the L buffer because the corresponding memory blocks of the circulant matrices in the column block is placed circularly at an interval of 9216 bytes. The new variable node information $Z_{nm}$ and $Z_n$ is calculated using formula (4) and (5) and the content in the L buffer and the Z buffer is updated until the updating of the 256 variable nodes in the same column block is completed.

When the variable node updating of all the column blocks is completed in step S45, the method enters step S46 to determine whether the maximal iteration number is reached. If it is reached, an output decision is made according to the sign of $Z_n$, if not, the method returns to step S42 to perform parity check on all the column blocks and start a new round of iteration.

The second embodiment of the invention will be described below accompanied with the drawings.

The present embodiment uses irregular QC-LDPC code with a code length of 17280 and a code rate of ¾. Its check matrix H is composed of 120×480 sub matrices, each with 36 elements.

The check matrix H is divided into 120 row blocks vertically, each with $R_i$ (i=1, 2, . . . , 120) circulant permutation matrices, and 480 column blocks horizontally, each with $$C_j(j = 1, 2, \ldots K = \sum_{i=1}^{120} R_i = \sum_{j=1}^{480} C_j$$

permutation matrices. Altogether the check matrix H contains circulant permutation matrices.

The general-purpose processor 1 of the QC-LDPC code decoder of the embodiment is a Micro Processing Unit (MPU). The data memory area 2 is an external Synchronous Dynamic Random Access Memory (SDRAM). The parity check and the variable node updating are handled by MPU, while the check node updating by the hardware accelerator 3 which is a coprocessor integrated with MPU.

The QC-LDPC code decoder in the embodiment applies Offset BP decoding algorithm calculated in accordance with the following formula:

Initialization:

$$Z_{nm}^{(0)} = LLR_n \tag{6}$$

$$Z_n^{(0)} = LLR_n \tag{7}$$

Wherein, $Z_n$ indicates the information of the variable node n, while $Z_{nm}$ is the information transmitted from the variable node n to the check node m. $LLR_n$ indicates the Log-Likelihood Ratio of each recipient code element.

Check Node Updating:

$$L_{mn}^{(i)} = \left( \prod_{n' \in N(m)\backslash n} \text{sign}(Z_{n'm}^{(i-1)}) \right) \times \max\left\{ \left( \min_{n' \in N(m)\backslash n} |Z_{n'm}^{(i-1)}| \right) - \beta, 0 \right\} \quad (8)$$

Wherein, $L_{mn}$ indicates the information transmitted from the check node m to the variable node n. $N(m)\backslash n$ indicates the set of all the variable nodes connected with the check node m except the variable node n. The superscript i indicates the number of iteration. The "sign" means symbolic operation, while "min" and "max" to indicates minimum and maximum operation, respectively. $\beta$ is a shift factor.

Variable Node Updating:

$$Z_{nm}^{(i)} = LLR_n + \sum_{m' \in M(n)\backslash m} L_{m'n}^{(i)} \quad (9)$$

$$Z_n^{(i)} = LLR_n + \sum_{m' \in M(n)} L_{m'n}^{(i)} \quad (10)$$

$M(n)\backslash m$ indicates the set of all the check nodes connected with the variable node n except the check node m, while $M(n)$ is the set of all the check nodes connected with the variable node n.

Three data memory blocks, i.e. the LLR buffer, the Z buffer and the L buffer, are also required during the decoding process. Among these blocks, the LLR buffer, with a total of 17280 units of data, is used to store the Log-Likelihood Ratio $LLR_n$ of each recipient code element; the Z buffer, with a total of 17280 units of data, is used to store the variable node information $Z_n$; the L buffer, with a total of K×36 units of data, is used to store the check node information $L_{mn}$ and variable node information $Z_{nm}$, i.e. to allocate a segment of 36-byte memory block for every circulant permutation matrix. In order to facilitate the information transmission between the MPU and the coprocessor during the check node updating, the corresponding memory blocks of the circulant permutation matrices in the same row block are placed consecutively in the L buffer.

Four look-up tables, namely Position-Table, Shift-Table, Row-Table and Column-Table are established by MPU. The Position-Table with 120 rows, each containing $R_i$ units of valid data, is used to store the positions of the corresponding memory blocks of the $R_i$ circulant permutation matrices in the same row block in the Z buffer. The Shift-Table with 120 rows, each with $R_i$ units of valid data, is used to store the offsets of the $R_i$ circulant permutation matrices in the row block relative to identity matrix. The Row-Table with 120 rows, each with $R_i$ units of valid data, to is used to store the positions of the corresponding memory blocks of the $R_i$ circulant permutation matrices in the row block in the L buffer. The Column-Table with 480 rows, each with $C_j$ units of valid data, is used to store the positions of the corresponding memory blocks of the $C_j$ circulant permutation matrices in the column block in the L buffer.

The QC-LDPC code decoder in the embodiment uses Group Shuffle as information transmission scheduling strategy.

Figure 6:
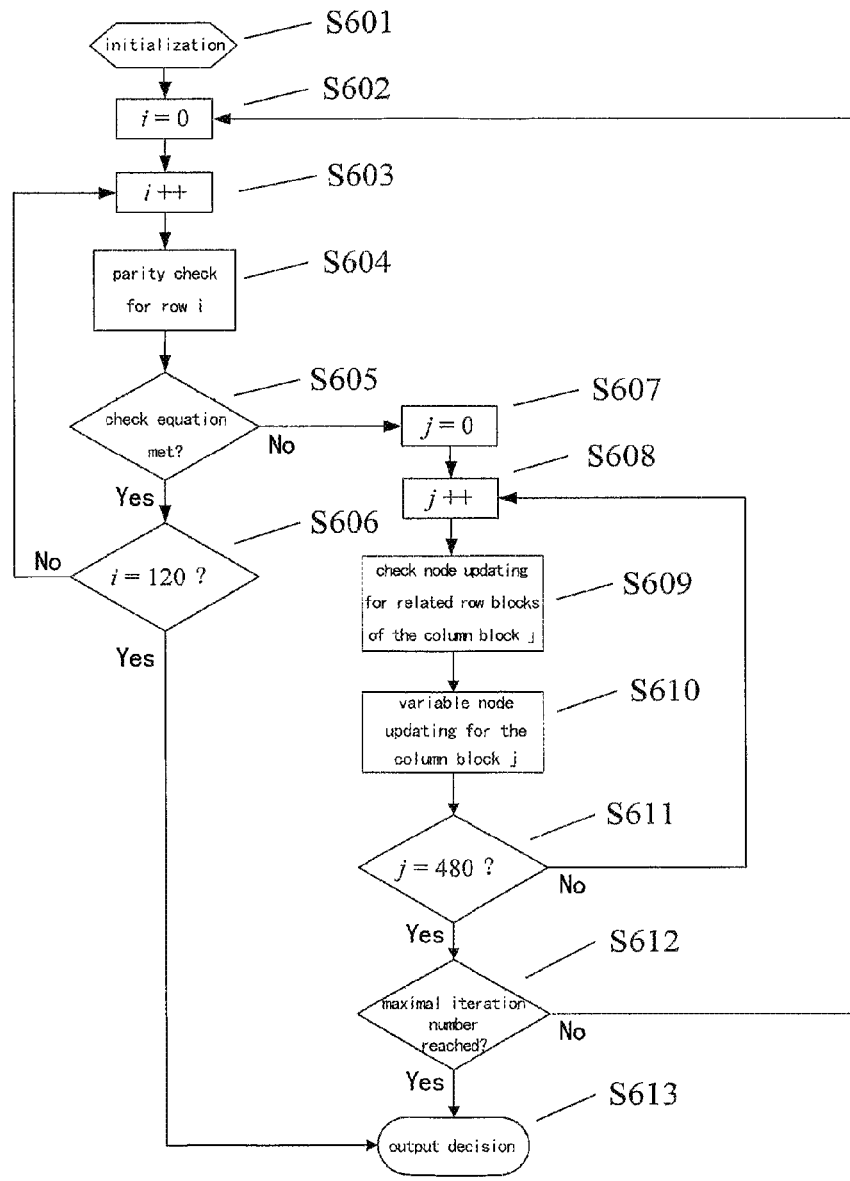
FIG. 6 is a flow diagram illustrating the operation of the QC-LDPC code decoder according to the second embodiment of the present invention.

FIG. 6 is a flow diagram illustrating the operation of the QC-LDPC code decoder used in the embodiment.

As shown in FIG. 6, first in the initialization step S601, the values of the variable node information $Z_{nm}$ and $Z_n$ (n=1, 2, ..., 17280, m=1, 2, ..., 4320) are initialized as $LLR_n$ (n=1, 2, ..., 17280). Then step S602, the number of row blocks i is set to zero and cycle is performed to the number of row blocks i from step S603.

Then the procedure enters step S604 to perform parity check on the row block i, which is carried out row block by row block. Since the variable nodes involved in the parity check in every row blocks have quasi circulant feature for the positions of variable nodes, when performing parity check on the row block i (i=1, 2, ..., 120), MPU can easily locate information $Z_n$ of $R_j$ variable nodes involved in every check equations of the row block in the Z buffer, according to the row i in the Position-Table and the Shift-Table. Then parity check is conducted using the sign of $Z_n$ until the 36 check equations in the row block are computed.

Then the flow enters step S605 to determine whether the check equations of the current row block are met. If all the check equations are met and i is less than 120 in step S606, the flow returns to step S603, i is increased by 1 and continue to perform parity check on the next row block. If i is determined to have reached 120, meaning the check equations of all the row blocks are met, the decoding is deemed successful and the procedure enters step S613 to make an output decision according to the sign of $Z_n$.

If certain check equation in the current row block is not met in step S605, the flow enters step S607, set the number of column blocks j to zero and cycle is performed to the number of column blocks j from step S608.

The variable nodes are divided into 480 groups corresponding to the 480 column blocks. First in step S609, check node updating is carried out for the row blocks related to the first column block, i.e. performing check node updating for the row blocks to which the $C_1$ circulant permutation matrices in the first column block related. Then in step S610, variable node updating is conducted for the first column block.

Subsequently, check node updating is conducted for the row blocks related to the second column block and then variable node updating is performed for the second column block. And the similar procedure is repeated until j reaches 480. In step S611, a determine is made whether j is less than 480. The flow returns to step S608 if j is less than 480, in step S608 j is increased by 1 and the flow inters S609 and S610 to perform check node updating for the next row block related to the column block and conduct variable node updating for the next column block. Because the new information obtained by the variable node updating for each group is immediately applied to the check node updating for the subsequent groups, the convergence speed of the decoding is effectively improved and the iteration number is reduced, thus improving the decoding throughput.

In the same way, the check node updating is carried out row block by row block. When performing check node updating for the row block i (i=1, 2, ..., 120), MPU can locate the corresponding memory blocks of the $R_i$ circulant permutation matrices of the row block in the L buffer, according to the row i of the row block. Via internal data bus, the variable node information of the $R_i$ blocks (each with 36 units of data) in the L buffer is written into the coprocessor, while simultaneously notifying the coprocessor of the current written-in row block number i and the number of circulant permutation matrices in the row block $R_i$. Since the corresponding memory blocks of the circulant permutation matrices in the same row block are placed consecutively in the L buffer, the variable node information of the $R_i$ blocks can be written in continuously.

Four data buffers, namely, Sign buffer, Min buffer, Index buffer and Sub-Min buffer, are needed in the coprocessor and they have the same function as the four data buffers of FPGA in the first embodiment. The difference is that in the present embodiment the Sign buffer stores $R_i \times 36$ signs and the Min buffer, the Index buffer and the Sub-Min buffer contains 36 units of data each.

After the variable node information is written in, MPU reads out the check node information of the corresponding $R_i$ blocks (each with 36 units of data) from the coprocessor and update the L buffer via the internal data bus. Similarly, because the corresponding memory blocks of the circulant permutation matrices in the same row block are placed consecutively in the L buffer, the check node information of the $R_i$ blocks can be read out continuously. The coprocessor outputs the new check node information $L_{mn}$ using the formula (6) based on the values in the Sign buffer, the Min buffer, the Sub-Min buffer and the Index buffer.

The variable node updating is carried out column block by column block. When performing variable node updating for the column block j (j=1, 2, . . . , 120), MPU can locate the corresponding memory blocks of the $C_j$ circulant permutation matrices of the column block in the L buffer, according to the row j of the column block. Using the formula (7) and (8), the variable node information $Z_{nm}$ and $Z_n$ is calculated and the L buffer and the Z buffer are updated until the updating of the 36 variable nodes in the column blocks is completed.

If the j is determined to be 480 in step S611, meaning the variable node updating for all the column blocks is completed, the flow enters step S612 to decide whether the maximal iteration number is reached. If it is reached, the procedure enters step S613 and an output decision is made according to the sign of $Z_n$, if not, the procedure returns to step S602 again to perform parity check and start a new round of iteration.

As described above, the present invention are illustrated according to the above two embodiments. However, the present invention is not limited to the above specific embodiments. As obvious to those skilled in the art, any change or variation to the present invention is possible without departing from the spirit and scope of the present invention. But these changes and variations should be within the protection of the attached claims of the present invention.

What is claimed is:

1. A QC-LDPC code decoder, comprising:
a general-purpose processor configured for:
distributing storage space for data memory area based on the structure of the QC-LDPC code check matrix;
establishing an index for data addressing;
controlling the QC-LDPC code decoding process;
scheduling information processing operations during the decoding process; and
realizing part of the information processing operations during the decoding process including parity check, check node updating, and variable node updating;
a data memory area configured for storing the information needed for the decoding process block by block, wherein the information includes initial information of the variable nodes, check node information and variable node information during iteration; and
a hardware accelerator configured for conducting all or part of the information processing operations during the decoding process including parity check, check node updating, and variable node updating, and
wherein, when the hardware accelerator is used to accomplish part of the information processing functions during the decoding process including parity check, check node updating, and variable node updating, the remaining information processing functions are completed by the general-purpose processor.

2. The code decoder according to claim 1, wherein the hardware accelerator further comprises:
a data interface configured for adapting the time sequence and the format of the write-in/read-out data;
a data buffer configured for storing intermediate variables during the information processing;
a computing unit configured for conducting computation of the needed information; and
a control unit configured for controlling the operation of the hardware accelerator.

3. The code decoder according to claim 2, wherein the data buffer further comprising:
a sign buffer configured for storing signs of the variable node information;
a min buffer configured for storing the minimums of the absolute values of the variable node information involved in the updating of the same check node;
an index buffer configured for storing the positions of the variable nodes with the minimums; and
a sub-min buffer configured for storing the second minimums of the absolute values of the variable nodes information involved in the updating of the same check node.

4. The code decoder according to claim 1, wherein the corresponding memory blocks of circulant permutation matrices in the same row block or column block of the QC-LDPC code check matrix are placed consecutively in the data memory area.

5. The code decoder according to claim 1, wherein for regular QC-LDPC code, the corresponding memory blocks of circulant permutation matrices in the same row block or column block of its check matrix are placed consecutively or at identical intervals in the data memory area.

6. The code decoder according to claim 1, wherein the hardware accelerator comprises:
a hardware circuit independent of the general-purpose processor; or
a specialized processor integrated with the general-purpose processor; or
an additional set of special commands designed specifically for the QC-LDPC code decoding and based on the command set of the general-purpose processor.

7. The code decoder according to claim 1, wherein the parity check and the check node updating are conducted synchronously to further enhance the decoding throughput.

8. The code decoder according to claim 1, wherein the check node updating and variable node updating are performed alternatively to increase the decoding convergence speed and reduce iteration times.

9. A QC-LDPC code decoding method, characterized in using means of software hardware accelerator to perform the QC-LDPC code decoding, the method comprising:
distributing the storage space for a data memory area based on the structure of a QC-LDPC code check matrix and establishing an index for data addressing by a general-purpose processor;
storing, block by block, the information which is needed for the decoding process by the memory area, the information comprising initial information of the variable nodes, check node information, and variable node information during iteration;
initializing the data memory area and then performing parity check row block by row block by the general-purpose processor or a hardware accelerator;

if the check equations of all the row blocks are met, an output decision is made, if not, check node updating is performed row block by row block and variable node updating is conducted column block by column block by the general-purpose processor or the hardware accelerator;

transmitting the needed information block by block between the general-purpose processor and the hardware accelerator; and if the maximal iteration number is reached, an output decision is made, if not, the repeating the step of parity check and starting a new round of iteration, and wherein, when the hardware accelerator is used to accomplish part of the information processing functions during the decoding process including parity check, check node updating, and variable node updating, the remaining information processing functions are completed by the general-purpose processor.

10. The decoding method according to claim 9, further comprising:

inputting the needed information transmitted from the general-purpose processor to the hardware accelerator into a computing unit via a data interface;

inputting the values in a data buffer which stores intermediate variables during the information processing into the computing unit, calculating with the inputted information, and updating the content stored in the data buffer under the controlling of a control unit; and outputting the results of the information processing operations according to the values in the data buffer via the data interface.

11. The decoding method according to claim 9 or 10, wherein the check node updating comprises:

inputting the signs of the variable node information transmitted from the general-purpose processor to the hardware accelerator into a sign buffer and inputting the absolute value of the information into a comparator via an input data interface;

inputting into the comparator the absolute values of variable node information involved in the updating of the same check node in a min buffer and a sub-min buffer, comparing them with the absolute values of the inputted variable node information to obtain a new minimum, a second minimum, and the position of the new minimum, and updating the content stored in the min buffer, the sub-min buffer, and the index buffer under controlling of the control unit; and outputting the new check node information according to the values in the min buffer, the sub-min buffer, and the index buffer and after certain correction via an output data interface.

12. The decoding method according to claim 9, wherein the corresponding memory blocks of circulant permutation matrices in the same row block or column block of the QC-LDPC code check matrix are placed consecutively in the data memory area.

13. The decoding method according to claim 9, wherein for regular QC-LDPC code, the corresponding memory blocks of circulant permutation matrices in the same row block or column block of its check matrix are placed consecutively or at identical intervals in the data memory area.

14. The decoding method according to claim 9, wherein the parity check and the check node updating are conducted synchronously to further enhance the decoding throughput.

15. The decoding method according to claim 9, wherein the check node updating and variable node updating are performed alternatively to increase the decoding convergence speed and reduce iteration times.

16. A QC-LDPC code decoder, comprising:

a general-purpose processor configured for:
  distributing storage space for data memory area based on the structure of the QC-LDPC code check matrix;
  establishing an index for data addressing;
  controlling the QC-LDPC code decoding process;
  scheduling information processing operations during the decoding process; and
  realizing part of the information processing operations during the decoding process including parity check, check node updating, and variable node updating;

a data memory area configured for storing the information needed for the decoding process block by block, wherein the information includes initial information of the variable nodes, check node information and variable node information during iteration; and a hardware accelerator configured for conducting all or part of the information processing operations during the decoding process including parity check, check node updating, and variable node updating.

* * * * *